Figure 1B:
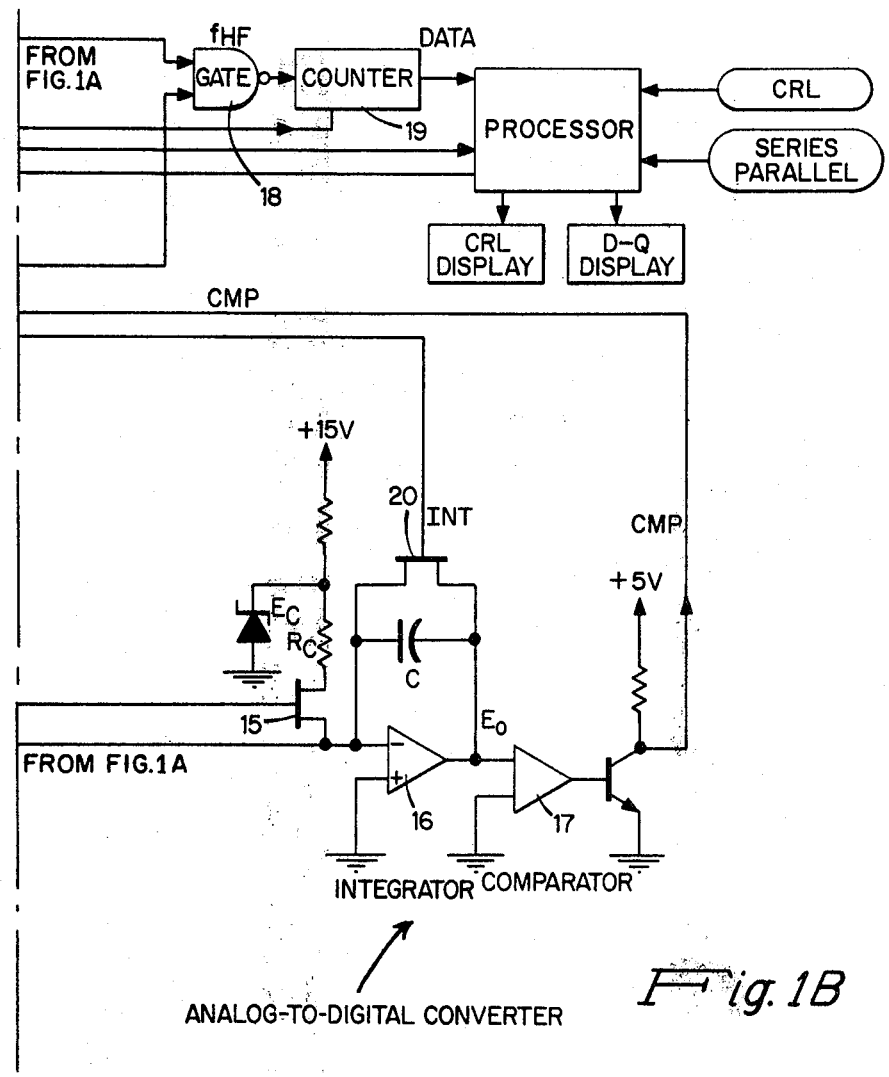

United States Patent [19]

Hall

[11] 4,342,089
[45] * Jul. 27, 1982

[54] METHOD OF AND APPARATUS FOR AUTOMATIC MEASUREMENT OF CIRCUIT PARAMETERS WITH MICROPROCESSOR CALCULATION TECHNIQUES

[75] Inventor: Henry P. Hall, Concord, Mass.

[73] Assignee: GenRad, Inc., Concord, Mass.

[*] Notice: The portion of the term of this patent subsequent to Apr. 1, 1997, has been disclaimed.

[21] Appl. No.: 105,269

[22] Filed: Dec. 19, 1979

Related U.S. Application Data

[62] Division of Ser. No. 719,810, Sep. 2, 1976, Pat. No. 4,196,475.

[51] Int. Cl.³ ............................................. G06F 15/20
[52] U.S. Cl. ................................. 364/481; 324/57 R; 364/571
[58] Field of Search ............... 364/480, 482, 550, 551, 364/570, 602, 606, 557, 558, 483, 556, 481, 571; 324/57 R, 73 AT; 323/101, 121, 120; 340/347 AD

[56] References Cited

U.S. PATENT DOCUMENTS

| | | | |
|---|---|---|---|
| 3,142,820 | 7/1964 | Daniels | 364/550 |
| 3,445,763 | 5/1969 | Harris, Jr. | 364/482 |
| 3,562,641 | 2/1971 | Fulks | 324/57 R |
| 3,593,126 | 7/1971 | May | 324/57 R |
| 3,652,930 | 3/1972 | Sugiyama | 324/57 R |
| 3,781,869 | 12/1973 | Sudnick et al. | 364/557 |
| 3,789,661 | 2/1974 | Melsheimer | 364/556 |
| 3,818,207 | 6/1974 | Zschimmer | 364/557 |
| 3,829,666 | 8/1974 | Hohenberg et al. | 364/557 |
| 3,859,594 | 1/1975 | Grindheim | 324/57 R |
| 3,984,768 | 10/1976 | Staples | 364/482 |
| 3,992,665 | 11/1976 | Preikschat | 324/57 R |
| 4,034,190 | 7/1977 | White | 364/525 |

Primary Examiner—Errol A. Krass
Attorney, Agent, or Firm—Rines and Rines, Shapiro and Shapiro

[57] ABSTRACT

This disclosure is concerned with a new technique for automatically measuring impedance (though the process is also applicable to other parameters and characteristics as well) wherein a series of voltages are sequentially presented to a common detector and analog-to-digital converter, the numerical values of which voltages are of themselves meaningless, but from which, with the aid of microprocessor calculating equipment, ratios may be calculated that indicate impedance (or other parameters).

22 Claims, 3 Drawing Figures

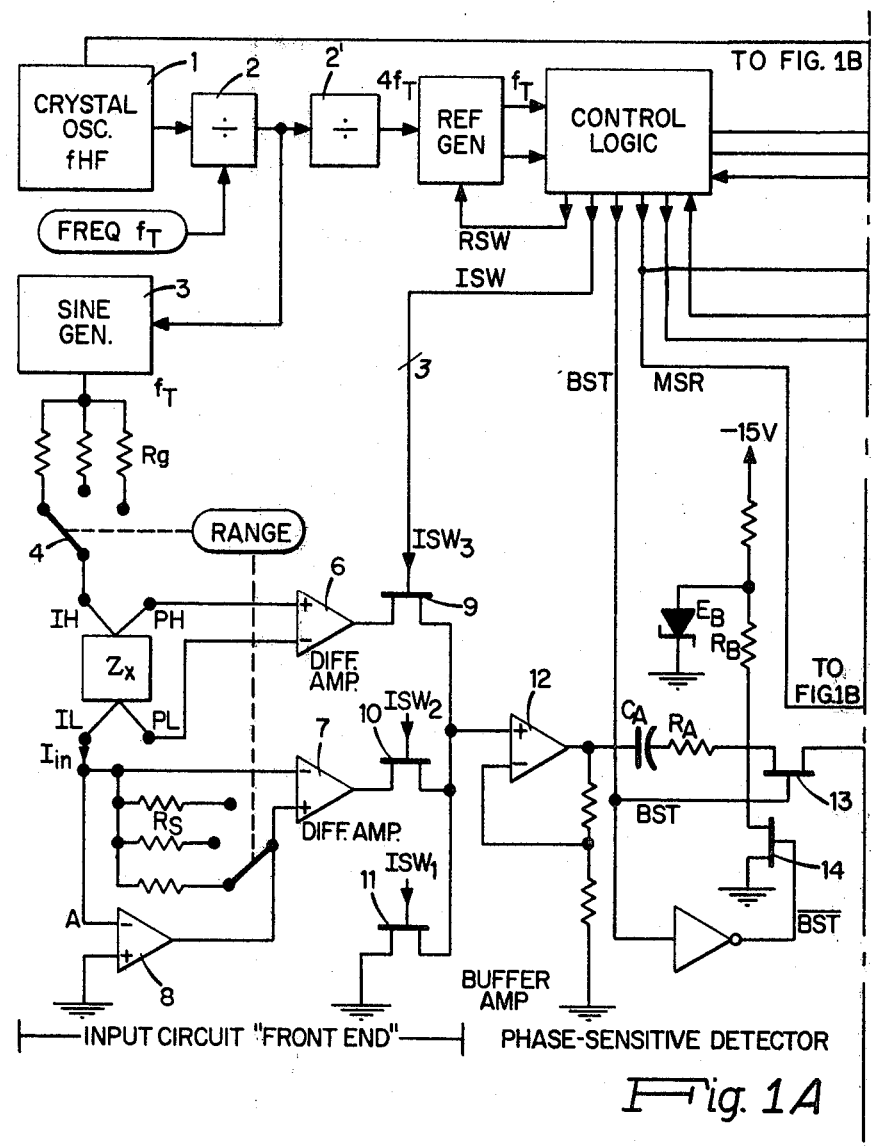

METHOD OF AND APPARATUS FOR AUTOMATIC MEASUREMENT OF CIRCUIT PARAMETERS WITH MICROPROCESSOR CALCULATION TECHNIQUES

This is a divisional application of Ser. No. 719,810, filed Sept. 2, 1976, and now U.S. Pat. No. 4,196,475.

The present invention relates to methods or and apparatus for automatic measurement of impedance or other parameters and characteristics, being more particularly directed to the incorporation of microprocessor type calculating techniques to provide simplified measurement steps and instrumentation.

While the underlying philosophy or technique herein will be specifically described in connection with its illustrative application to automatic impedance measurement, it will be evident, as hereinafter more fully detailed, that the same is applicable also to other types of instrumentation wherein the same type of advantages may be sought.

The art is replete with bridge and related circuits evolved through the decades to enable the measurement of the electrical impedance of circuit elements. Because impedance, as defined by Ohm's Law ($Z=E/I$), is the result of a division, all impedance measuring instruments must in some manner effect a division. In general, impedance bridges embody the concept of using balancing network arms to obtain equal voltage ratios from which to determine the value of an unknown impedance element in one of the arms. As an illustration, a standard capacitor may be used as an arm to measure the current through an unknown capacitor in a voltage divider connection wherein the other bridge arms, serving as a calibrated divider, are adjusted to produce the same ratio by a successive balancing process producing different ratios until one is obtained that matches the capacitor ratio—in effect, a trial-and-error method of division. Of more recent years, such balancing has been effected with various degrees of automatic operation as described, for example, in my prior U.S. Pat. No. 2,872,639 and in U.S. Pat. No. 3,562,641. See, also, Fulks, R. G., "The Automatic Capacitance Bridge", GR Experimenter, April 1965. Such automatic balancing may employ digital-to-analog converters that produce certain voltage ratios which the detector indicates must be raised or lowered until the balance is obtained, again by this trial-and-error division principle. Inherent in such measurement systems, moreover, has been the requirement for long-term control and stability of circuit components and standards, and calibration requirements.

Other impedance measuring devices that do not use adjustable elements to obtain a balance are referred to as impedance meters. Some of these keep either the voltage across the unknown impedance constant or the current through it constant, so that the measured current or voltage is proportional to impedance or admittance, respectively, with only one quantity needing measurement. This, in effect, is division by a constant. Other meter-type instruments, on the other hand, measure voltage and current and obtain the ratio by analog division methods. (See, for example, Hall, H. P., "An AC-DC Ratiometer and Its Use in a CRL Meter", IEEE Transactions on Instrumentation and Measurement, December 1973, p. 387).

In accordance with the present invention, however, it has been found that through novel incorporation of certain calculating abilities of microprocessors in radically different network configurations, much simpler measurements may be made without trial-and-error balancing of bridges, void of the necessity for long-time voltage or current stability of certain meters, and void of the requirement for long-term component stability in both types of impedance instruments, and that revolutionize the automation of impedance measuring; it accordingly being an object of the invention to provide a new and improved method of and apparatus for automatic measurement of impedance, free of the longstanding disadvantages of prior art approaches above-discussed.

The use of such microprocessor or calculator incorporation is for quite a different purpose, moreover, than other relatively recent uses in instrumentation that are concerned, rather, with adding supplemental or additional functions or features to the instrument, enabled by the processor, such as readout techniques, more versatile control, interfacing with other equipment, or providing corrections for more accurate measurements. Reference may be made, for example, to an article entitled "Microprocessors Are Making the 'Impossible' Possible" by Jules H. Gilder, appearing in Electronic Design, No. 24, Nov. 22, 1975, commencing at p. 52, which describes such general microprocessor usages; to a further article, "Microprocessor DVMs, With New Features, to Hit the Market Shortly", by Stanley Runyon, appearing in Electronic Design, 16, Aug. 2, 1975; and to Lee, R. C., "Microprocessor Implementation of a Measurement Instrument and Its Interface". An instrument-and-processor combination incorporating an impedance bridge to indicate parallel capacitance and D (dissipation factor) and a microprocessor to convert the data to series capacitance is described in the Boonton Electronics Corp. Mar. 4, 1975 specification bulletin Model 76A Automatic 1 MHz Bridge; this being the same function earlier attained with a separate automatic bridge and mini-computer. (See, for example, Operating Instructions for GR Type 2990-9174 "Automatic Capacitance-Testing System" Book 1, January 1970 of the assignee, herein, GenRad, Inc., formerly known as General Radio Company). While such incorporation of the microprocessor in the same housing as the bridge enables obtaining output data on the instrument in a more desirable form, it does not change the bridge circuit itself or its method of measurement operation. Use of the capabilities of a separate computer for increasing the accuracy of conventional bridge or meter methods for control and calculation purposes and the like are also described by Geldart, W. J., "Improved Impedance Measuring Accuracy with Computer-Operated Transmission Sets", IEEE Transactions on Instrumentation and Measurement, December 1975, p. 327; and in my articles "A Technique for Avoiding Correction Errors in Computerized Impedance Measuring Systems", and "Techniques Used in a Fast Computer-Controlled DC Bridge", appearing in the IEEE Transactions on Instrumentation and Measurement, November 1971, p. 249, and December 1974, p. 359, respectively; and to Julie, L., "A High-Accuracy Digital Instrument Design for DC Measurements", in the same IEEE Transactions of November, 1972, p. 323.

The before-mentioned use of the microprocessor for corrections, checks or calibrations is illustrated by an article by Tarczy-Hornoch et al, "Microprocessor-Controlled Self-Calibration and Diagnostics in a Digital Multimeter" (Systron-Donner Corporation) ELEC- TRO '76 Professional Program, May 11-14, 1976; and in "Impact of Microprocessors on Design of Analog Instruments", by D. Abenaim of the assignee of this application, GenRad, Inc., presented at the said IEEE May, 1976 ELECTRO '76.

Other uses of computation in related circuits are found in U.S. Pat. Nos. 3,569,785 and 3,692,987, with the system of the former patent requiring multiple sample-and-hold phase-sensitive detectors for enabling impedance calculation.

Unlike these techniques, the present invention, in its application to impedance measurement, in summary, is concerned with the radical redesign of the impedance-measuring circuit itself, the substitution of a very different network that does not in any sense involve bridge-balancing techniques, that requires a pair of successive voltage measurements, of meaningless values in and of themselves, but that when applied to the microprocessor are used in a calculation to compute a meaningful quantity corresponding to the voltage-current ratio (previously effected by the successive approximation bridge adjustments) that represents the desired impedance value.

A further object of the invention, accordingly, is to provide a novel impedance measuring method and circuit apparatus that cooperates with microprocessor or similar calculator circuits in a new manner to effect impedance or related measurements.

Still another object is to provide simplified measuring steps and apparatus not only applicable to the automatic impedance measuring field but to determining other parameters, as well.

Other and further objects will be explained hereinafter and more fully delineated in the appended claims.

Figure 2:
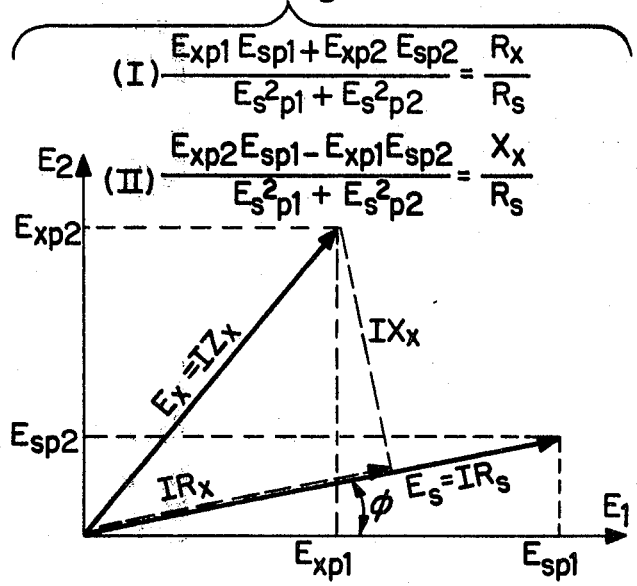

The invention will now be described with reference to the accompanying drawings, FIGS. 1A and 1B of which are a schematic circuit diagram illustrating a preferred embodiment illustratively shown applied to the exemplary automatic impedance-measuring application; and FIG. 2 is a vector diagram of the measurement technique underlying the system of FIGS. 1A and 1B.

Referring to FIGS. 1A and 1B, the system basically involves a front end comprising a sinewave generator a.c. source 3, controlled from a crystal oscillator 1 and frequency divider 2, applied to a network comprising the unknown impedance-to-be-measured $Z_x$, connected in series with standard resistance $R_s$ across the source 3. Through respective differential amplifiers 6 and 7 and switches 9, 10, 11, two successive measurements can be made; first, of the voltage $E_x$ across $Z_x$, which may be stored, and then the voltage $E_s$ across $R_s$. As hereinafter more fully explained, these voltages are applied to a common phase-sensitive detector and analog-to-digital converter, so-labelled, and thence applied to a microprocessor, labelled PROCESSOR, with its associated CONTROL LOGIC, to calculate the ratio $E_x/E_s$ and thereby obtain a measurement of $Z_x/R_s$. Through the use of the microprocessor in this cooperative combination, division is effected in a simple manner with as many digits as desired; and the technique permits of the use of but a single detector. The detector, moreover, and analog-to-digital converter, in the use required by this circuit and method, has the relaxed requirement of constant sensitivity only for the short measurement time; and, unlike prior art bridge and related circuits, has no long-term stability or drift requirements. The calibration factor involved in this measurement, moreover, cancels out in the division. Similarly, the input voltage or current $I_{in}$, unlike many measurement circuits, needs no long-term stability for measurements; it only needs short-term stability for measurement. The only parameter or quantity, indeed, that must be substantially constant over the long term or must have high precision and stability, in accordance with the invention, is the standard resistance $R_s$.

Still another improvement over prior bridge techniques underlying the invention is the resolution available over a wide range. For a conventional manual bridge with decade adjustment, for example, increased resolution is attained as full scale is approached; but at full scale, there is nothing further that can be done save changing a ratio arm to obtain a new range. This has to be done, furthermore, again and again over the entire range of the bridge, with resolution in a 10-to-1 range bridge varying from 10 to 1, and, on the lowest range, all the way to zero. With the novel $E_x/E_s$ technique of FIGS. 1A and 1B, on the other hand, there is no adjustable decade required and one does not run out of adjustment range. With the PROCESSOR, on the other hand, there is a floating decimal point, obviating the problem of running out of digits that forces range changes. The ratio of $E_x$ to $E_s$, moreover, has a resolution error which is the sum of the errors of the two voltage measurements, producing successive symmetrical humped resolution curves as a function of unknown impedance range, as distinguished from reaching a top limit in prior art decade switching systems. This characteristic has the added feature of enabling a full range to be covered in a practical instrument (say from 0.1 to 10 M), with but three standard resistors $R_s$.

With regard to the analog-to-digital converter, a preferred type employs a dual-slope integrator 16, as also discussed in my previously cited IEEE articles and in, for example, U.S. Pat. No. 3,074,057. The voltage output of the phase detector, later discussed, applies a current to capacitor C, shown above 16, for a fixed time while switch 13 (an FET) is closed, causing C to integrate current in storing charge. When switch 13 is opened, switch 15 closes, and a current of opposite sign occurs in the discharge of C. The measurement of $E_x$ and $E_s$, successively, at the input, results in a digital conversion that, upon ratio calculation in the PROCESSOR, causes all of the parameters including C, frequency, auxiliary voltage, etc. to cancel out in the equations such that no circuit values require the precision or stability of prior art bridges and the like; only short-time stability during the time required to make both measurements is required.

For a.c. measurements, involving complex numbers, the detector is of the before-mentioned phase-sensitive type to enable determination of the component of $E_x$ that is in phase with the current I and the component that is in quadrature. Such a detector, as later delineated, provides $IX_x$ and $IR_x$ (where $X_x$ and $R_x$ are the reactive and resistive components of $Z_x$, respectively), from which C and L may be readily calculated, knowing the frequency. Thus, through the technique of the invention, unlike prior bridge techniques, no capacitance standard is used or needed, the reactance standard being the frequency. The only precision components, thus, are the three range resistors $R_s$ and the crystal-controlled frequency. This type of detector 12, etc. and analog-to-digital converter 16, 17, etc. in this setting provides added features of some rejection of harmonics and, with regular repeated measurements over some length of time, rejects completely the frequency that corresponds to this total time period.

Thus far, the use of the PROCESSOR with the circuit of FIGS. 1A and 1B has been described in connection with the calculation of the basic division of otherwise meaningless voltage measurements into impedance measurements. This has the effect of reducing the amount of precision analog circuitry, enabling more reliable and less expensive instrumentation, as well. The microprocessor is also used herein to enable the making of corrections; not by adjusting the standard resistors as in prior art systems, but by making measurements to determine the errors and inserting the corrections into memory.

It is now in order to describe in further detail the illustrated system of FIGS. 1A and 1B and its underlying method of operation. The input circuit or front end is shown controlled by the previously mentioned stable crystal oscillator source 1; in this case, a high-frequency stable signal source. In actual circuits constructed and successfully operated, the oscillator 1 had a frequency $f_{hf}$ of 26.1120 MHz. Frequency divider 2 feeds a reference signal $f_T$ to generate a low distortion sinewave at 3. While this may be done in any conventional well-known fashion, the sinewave generation may be effected, for example, by providing, say, $256 \times 1020$ Hz to the sinewave generator 3, and employing therein an 8-bit counter that cycles through 256 addresses of a PROM (not shown), programmed so that it contains, in successive addresses, digital approximations to a sinewave at fixed phase angle increments, with the digital PROM output connected to a stepwise analog voltage by a D-to-A converter. Clearly, other sinewave generating techniques may also be used.

The sinewave signal from the generator 3 is applied to a set of current-limiting resistors $R_g$, selected by manual range switch labelled RANGE, which is ganged to control also the selection of the standard resistor $R_s$. Because the before-mentioned differential amplifiers 6 and 7 and the inverting amplifier 8, connected across the standard resistors, all have very high input impedances, substantially all the current $I_{in}$ flows through both the unknown impedance $Z_x$ to be measured and the standard resistance $R_s$. The inverting amplifier 8 holds the junction A of $Z_x$ and $R_s$ at a virtual ground so that impedance between this point and ground would pass very little current, thus guarding the measurement from this source of error.

The two differential amplifiers 6 and 7 produce signals proportional to $I_{in}Z_x$ and $I_{in}R_s$. They use precision resistors in similar low-gain circuits so that their gains are stable and closely equal. Three switches 9, 10, and 11, such as FET's or the like, select the input to a buffer amplifier 12 which can be the output of either differential amplifier or a ground connection for the zeroing measurement in this embodiment, though the switch 11 may be omitted with a 180 degree-type zeroing technique later described. For this embodiment, however, these switches are controlled by three ISW (input switch) signals from the control circuit, respectively labelled $ISW_3$, $ISW_2$ and $ISW_1$. The buffer amplifier 12 in turn applies the selected input to the before-mentioned ac phase-sensitive detector and analog-to-digital converter circuits. A capacitor $C_A$ is added to block dc so that the offset voltages of amplifiers 6, 7, 8 and 12 do not affect the measurement. This allows the use of only one zeroing measurement to correct for offsets in the integrator amplifier 16 of the analog-to-digital converter and its comparator 17. Adding the capacitor $C_A$ requires that an additional switch 14 be used to keep this capacitor from charging as the gating switch 13 is off. If capacitor $C_A$ is not included as for d.c. measurements, two zeroing measurements would have to be made to correct for offset voltages in the two differential amplifiers, and the input signal would have to be removed for these measurements.

A fixed dc current source, made up of $E_B$ and $R_B$, insures that the current through the gating switch is always negative, no matter what the relative phase is between the reference and input signals, so that the integrator "up" slope is always up. The gating switch is driven by a burst of reference pulses (BST) generated from the crystal oscillator 1 by appropriate frequency dividers 2, 2' and a 90 degree reference generator (REF GEN), with the controller (CONTROL LOGIC) selecting the proper phase with the RSW signal, as is well known. The reference generator generates a pair of square waves ($E_1$ and $E_2$) that are 90 degrees apart from the signal $4f_T$, synchronous with $E_x$ and $E_s$, but not phase related to them. In practice, this may be simply done, for example, with three flip-flops, enabling low nanosecond relative time difference operation. A value of D (i.e. dissipation factor R/X), as an illustration, of the order of 0.001 at 1 KHz represents only 160 nanoseconds, which is readily handled by the logic. As later more fully explained, from the two references $E_1$ and $E_2$ (FIG. 2), the components of both $E_x$ and $E_s$ that are in phase with each of them can be obtained ($E_{sp1}$, for example, being the component of $E_s$ in phase with $E_1$, etc.); and from these four quantities, the required ratios may be readily electronically calculated in the microprocessor as will be evident from the hereinafter discussed formulae I and II of FIG. 2. This result, moreover, is independent of the angle $\phi$ between the references and $E_s$, such that not only may the generated sinusoidal test signal $f_T$ have any phase, but the detector can also have any phase shift and any gain so long as it is constant for the short measurement time. An added advantage of this is the possible use of noise-reducing filtering in the detector without concern for phase shift.

A total of five measurements are made in accordance with this illustrative system, with integrator capacitor C shunted between each measurement with the switch 20 driven by the INT pulse.

The first measurement $M_0$ is the zeroing measurement with the buffer amplifier 12 connected to ground. This measurement is a measure of the fixed current $E_B/R_B$ plus the effects of any offset voltages or currents in the integrator 16 or comparator 17. A burst of reference pulses is thus applied with either reference (reference 1 shown as used), and the integrator output voltage increases. Seventeen reference pulses have been used, for example, for the 1020-Hz signal (two for a 120-Hz signal) which makes this integration independent of 60-Hz (hum) pickup. After the burst is finished, the signal MSR (measure) opens switch 15 to discharge the capacitor C. When the output voltage is returned to zero, the comparator 17 produces a signal to stop the MSR pulse. The length of this MSR pulse is thus a measure of the zeroing signal and is measured by using MSR to gate the high-frequency signal $f_{HF}$ at 18 into a counter 19. The resulting data are fed to the processor as a count $M_0$.

The remaining four measurements use different combinations of inputs (ISW) and references (RSW) to obtain the various components of both input signals ($IR_s$ and $IZ_x$) that are required to obtain the desired information. Since these measurements are all in error by the current $E_B/R_B$ and the integrator and comparator offsets, the zeroing measurement $M_o$ is subtracted from each of the other four measurements to get the four quantities used in the calculation of FIG. 2. This is an automatic, continual subtraction zeroing made for each voltage measurement as contrasted with an occasional zeroing for calibration measurement. Indeed, in accordance with the invention, the subtraction zeroing measurement does far more than correct for errors; the impedance measurement is meaningless without it.

The before mentioned 180 degree-type zero measurement may alternatively be employed, removing the shorting switch 11, and requiring a total of eight measurements. For this method, each of the four quantities ($E_{xp1}$, $E_{xp2}$, etc.) is determined by two measurements with reference signals opposite in phase (180 degrees apart). The difference between the two results is twice the desired quantity. The effects of offset voltages and the $E_B/R_B$ current are cancelled by the subtraction. This has several advantages: (1) the two measurements are done more closely in time to reduce the effects of drift; (2) the measurements are averaged, reducing the effects of noise; and (3) non-linearity in the detector is cancelled to some degree.

As is evident from FIG. 2, the measurements are entirely different from the analog phase-shifting measurements of prior art bridges and the like and do not use $E_x$ as a reference. To the contrary, 90 degree references $E_1$ and $E_2$ are used to enable two measurements of $E_x$ and $E_s$, the voltages ($IZ_x$ and $IR_s$) respectively across $Z_x$ and $R_s$ and constituting meaningless numbers per se insofar as impedance is concerned—one measurement with each reference. $E_2$ is plotted in FIG. 2 as the ordinate and $E_1$ as the abcissa, with the measurement vectors shown at $E_x$ and $E_s$, the latter at phase angle $\phi$. The projections of the vectors on the $E_2$ ordinate are $E_{xp2}$ and $E_{sp2}$, and the corresponding projections on the $E_1$ axis are $E_{xp1}$ and $E_{sp1}$. Equations (I) and (II) show how the ratios $R_x/R_s$ and $X_x/R_s$ may be calculated from these measurement quantities in the microprocessor. These ratios must be multiplied by the value of $R_S$ used for each range which is stored in the microprocessor. Only three range resistors are used because of the wide range it is possible to cover with each single resistor, as before explained.

When the calculated ratios are multiplied by $R_S$, the effective series values of resistance and reactance are thus presented. The measurement result, however, is sometimes required to be in terms of different parameters such as series capacitance and D or some other combination. If the frequency is known, and it is, and its value stored in the microprocessor memory, the microprocessor can, as is well known, calculate the result in any set of parameters desired. This can be done by first calculating $R_X$ and $X_X$ and then converting them by appropriate formulae or by using other combinations of the variables in the equations of FIG. 2, and frequency. Thus, as indicated in FIGS. 1A and 1B, CRL or D-Q displays may be effected.

It should be noted, as previously explained, that the calibration factors of the dual-slope integrator and phase-sensitive detector may be cancelled by using only the one integrator and detector to make two measurements and dividing the results. More generally, the calibration factor of any linear measuring device may be cancelled when it is used to make two, or more, measurements and the result is calculated by taking ratios of these measurements. While previous measurements of resistance have been effected by taking two separate measurements with a single voltmeter or potentiometer circuit, and complex impedance can also be measured by taking three voltage (magnitude) measurements, these are a far cry from the complete technique of the invention enabling calculation automatically and in practical small, self-contained instruments embodying inexpensive microprocessors. It is the essence of the method herein described, moreover, that the data given to the calculator is not the result of an impedance measurement, but separate voltage measurements that are meaningless in themselves. Thus, one of the two measurements is not a calibration measurement. When the voltage across the resistance standard is measured, it is not measured to calibrate a resistance measuring instrument; but, rather, is a voltage measurement which is proportional to the current through the unknown, and requires the cooperative use of the calculator to measure impedance. By means of automatic switching, a single detector-converter receives a succession of input voltages, and the unknown impedance is automatically calculated from the results of these voltage measurements. The microprocessor used in this way, furthermore, enables all kinds of operation on the final data.

Clearly, the "front end" system illustrated in FIGS. 1A and 1B may be modified for lower and higher frequencies; and the broad technique and philosophy underlying the invention may also be applied to direct-current systems for other uses wherein features of the invention are desired. Absent the front end, for example, a ratio meter is provided. If one input is connected to the input of a network and the other to the output, a transfer-function meter is achievable having advantageous features also provided by the invention, before discussed. If one input is a standard voltage, an a.c. or d.c. voltmeter may be constructed, providing average value for a.c. The technique also lends itself to phasemeter and even d.c. resistance meter application wherein the novel features underlying the broad method herein are sought. Further modifications for automatic electronic instrumentation embodying this novel philosophy and direction will also occur to those skilled in this art; and such are considered to fall within the spirit and scope of the invention as defined in the appended claims.

What is claimed is:

1. An apparatus for the automatic instrument measurement of a desired parameter comprising input switch means for supplying a plurality of voltages, the voltage values of which do not directly measure the desired parameter but which are related thereto by theoretical formulae; a phase-sensitive detector connected to the switch means for phase detecting the voltages; means for converting the phase-detected voltages to digital signals; control means for controlling the switch means; and microprocessor means for controlling the control means and for processing the digital signals in accordance with said formulae to automatically electronically calculate a quantity which is a measure of the desired parameter, said microprocessor means controlling the control means to cause the voltages to be successively supplied to the detector during a sufficiently short period of time to insure relatively constant stability of the detector and converting means during phase-detecting and converting.

2. The apparatus of claim 1, wherein the switch means comprises means for periodically supplying an input reference voltage to the detector.

3. The apparatus of claim 2, wherein the input reference voltage is selected such that offset voltages and currents of the detector and the converting means can be determined, and wherein the microprocessor means comprises means to compensate the digital signals to remove the effects of said offset voltages and currents from the digital signals prior to calculating said quantity.

4. The apparatus of claim 2, wherein said apparatus is a voltmeter and the desired parameter is the output voltage of a voltage source, and wherein the microprocessor means calculates the value of said output voltage by comparing said output voltage to the input reference voltage.

5. The apparatus of claim 1, wherein the apparatus is a ratio meter and the microprocessor means calculates the ratios of the supplied voltages.

6. The apparatus of claim 1, wherein the apparatus is a transfer-function meter for measuring the transfer function of a device, and wherein said voltages comprise an input voltage to the device and an output voltage from the device, and the microprocessor means calculates the ratio of the output voltage to the input voltage.

7. The apparatus of claim 1 further comprising means for generating a current and for applying the current to a device to be tested, said voltages being produced in response to the current.

8. A method of automatic instrument measurement of a desired parameter of a device to be tested comprising generating in an instrument an electrical current that is applied to the device; producing, in response to that current, and successively phase detecting a plurality of voltages in a single phase-sensitive detector, the voltage values of the voltages not being a measure of the desired parameter but being related by theoretical formulae to the desired parameter; converting the phase-detected voltages into corresponding digital signals in an analog-to-digital converter, said phase detecting and converting being performed during a period of time sufficiently short to ensure relatively constant stability of the phase detector and converter; and employing a microprocessor for automatically electronically calculating a quantity from said digital signals in accordance with said formulae, said quantity being a measure of the desired parameter.

9. The method of claim 8, wherein said phase-detecting step comprises determining the value of the component of each of said voltages which is in-phase with each of a pair of reference voltages, the reference voltages having a predetermined phase relationship to each other.

10. The method of claim 9 comprising effecting zeroing measurements to produce voltage values representative of fixed offset voltages and currents associated with said phase-detecting and converting, and compensating each of said digital signals to remove the effects of said fixed offset voltages and currents prior to said calculating.

11. The method of claim 8, wherein the desired parameter is the transfer function of the device and said voltages include an input voltage to the device and an output voltage from the device, and the calculating step includes calculating the ratio of the output voltage to the input voltage.

12. An apparatus for automatic instrument measurement of a desired parameter of a device to be tested comprising means for generating a current and for applying the current to the device; means for successively supplying a plurality of voltages from predetermined locations of the device, the values of the voltages not directly measuring the desired parameter but being related thereto by theoretical formulae, said voltages being produced in response to said current; a phase-sensitive detector for detecting the successive voltages; an analog-to-digital converter connected to the detector for converting the voltages to digital signals; the supplying means including means for supplying the voltages to the phase detector over a sufficiently short period of time to ensure relatively constant stability of the phase detector and converter during phase detecting and converting; and microprocessing means connected to the converter for processing said digital signals in accordance with said formulae to automatically electronically calculate a quantity which is a measure of the desired parameter.

13. The apparatus of claim 12, wherein said phase-sensitive detector comprises means for measuring the magnitude of the component of each of said voltages which is in-phase with each of a pair of reference voltages, the reference voltages having a predetermined phase relationship between them.

14. The apparatus of claim 13 comprising means for effecting zeroing measurements to measure offset voltages and currents associated with the detector and the converter, means for digitizing said zeroing measurements, and wherein said microprocessing means includes means for subtracting the digitized zeroing measurements from each of said digital signals prior to calculating said quantity.

15. The apparatus of claim 12, wherein the desired parameter is the transfer function of the device, and wherein said voltages include an input voltage to the device and an output voltage from the device and the microprocessing means calculates the ratio of said output voltage to said input voltage.

16. The apparatus of claim 12, wherein the desired parameter is the value of an output voltage of the device, and said voltages produced in response to said current include a reference voltage to which the output voltage of the device is compared.

17. A method of automatic instrument measurement of a desired parameter of a device being tested comprising successively detecting a plurality of voltages, the voltage values of which are related to the desired parameter by theoretical formulae; converting the voltages into corresponding digital signals; all of said detecting and converting being performed using the same detector and converter and during a period of time sufficiently short to ensure that the stability of the detector and the converter is substantially constant during said detecting and converting; and processing the digital signals in a microprocessor in accordance with said formulae to calculate a quantity which is a measure of the desired parameter.

18. The method of claim 17 comprising effecting zeroing measurements to produce voltage values representative of fixed offset voltages and currents associated with the detector and converter, and compensating each of the digital signals to remove the effects of said fixed offset voltages and currents prior to calculating said quantity.

19. The method of claim 17, wherein the plurality of voltages comprises first and second voltages which are selected such that said processing includes the calculation of a ratio of the first and second voltages.

20. An apparatus for automatic instrument measurement of a desired parameter of a device being tested comprising a single detector for successively detecting all of the voltages of a plurality of voltages, the voltage values of which are related to the desired parameter by theoretical formulae; a single converter for converting all of the voltages into corresponding digital signals; said detector and converter being constructed for performing said detecting and converting, respectively, during a period of time sufficiently short to ensure that the stability of the detector and the converter is substantially constant during the detecting and converting; and microprocessing means connected to the converter for processing said digital signals in accordance with said formulae to automatically calculate a quantity which is a measure of the desired parameter.

21. The apparatus of claim 20 further comprising means for effecting zeroing measurements to produce voltage values representative of fixed offset voltages and currents associated with the detector and converter, and wherein said microprocessing means includes means for compensating each of said digital signals to remove the effects of said fixed offset voltages and currents prior to calculating said quantity.

22. The apparatus of claim 20, wherein said plurality of voltages comprise first and second voltages selected such that the calculation of said quantity includes calculating a ratio of the first and second voltages.

* * * * *